United States Patent [19]

Ito

[11] 4,383,482
[45] May 17, 1983

[54] PRINTING MASK FOR USE IN PRINTING ON A BOARD HAVING A PROJECTED PORTION AND MANUFACTURING PROCESS THEREFOR

[75] Inventor: Tsukasa Ito, Toda, Japan

[73] Assignee: Clarion Company, Ltd., Tokyo, Japan

[21] Appl. No.: 281,594

[22] Filed: Jul. 9, 1981

[30] Foreign Application Priority Data

Jul. 9, 1980 [JP] Japan .................................. 55-92781

[51] Int. Cl.³ .............................................. B41F 15/36
[52] U.S. Cl. .................................. 101/127; 101/128.4; 101/35
[58] Field of Search .................... 101/114, 127, 127.1, 101/128.21, 128.4, 35

[56] References Cited

U.S. PATENT DOCUMENTS

| | | | |
|---|---|---|---|
| 430,457 | 6/1890 | Yule | 101/127 X |
| 1,648,993 | 11/1927 | Niederer | 101/114 |
| 1,730,271 | 10/1929 | Furnaro | 101/127 |
| 1,892,268 | 12/1932 | Flockhart | 101/127.1 X |
| 3,202,094 | 8/1965 | Smallman | 101/127 X |
| 3,769,908 | 11/1973 | Griffin | 101/127 |
| 4,084,506 | 4/1978 | Nakatani | 101/127 |

Primary Examiner—Clifford D. Crowder
Attorney, Agent, or Firm—Walllenstein, Wagner, Hattis, Strampel & Aubel, Ltd.

[57] ABSTRACT

A printing mask for use in printing on a board having a projection characterized in that a cavity member with a desired dimension is put on a screen tensed on a frame, a part of the screen surrounded by an open end of the cavity member is cut off, and thereafter, the other part of the screen is formed with a pattern to be printed.

10 Claims, 10 Drawing Figures

PRINTING MASK FOR USE IN PRINTING ON A BOARD HAVING A PROJECTED PORTION AND MANUFACTURING PROCESS THEREFOR

BACKGROUND OF THE INVENTION

1. Field of the Invention

The present invention relates to a printing mask for printing circuits with on a board having irregularities and a process for producing such a mask.

2. Description of the Prior Art

In case of forming a circuit on a board by means of printing, a printing mask has conventionally been used. Such printing mask has been made by forming a pattern to be printed on a cloth screen of silk, nylon or other sythetic fibers or alternatively on a stainless steel screen, the screen being tensed on a frame. Then, upon printing a circuit, the entire surface of the printing mask is in contact with the surface ofthe board. Therefore, if the board has a projecting portion, it has been impossible to print on it by using the printing mask of the above type. However, the present inventor has noted that if only a part of the printing mask having that pattern on it can fit on the surface of the board, it is not always necessary to press against the entire surface.

OBJECTS OF THE INVENTION

It is therefore an object of the present invention to provide a printing mask capable of printing a circuit on a board having a projecting portion thereon.

Another object of the invention is to provide manufacturing processes for producing such a printing mask.

SUMMARY OF THE INVENTION

In accordance with the present invention, there is provided a printing mask for use in printing on a board having a projecting portion, said mask comprising:

a screen member;

a frame member for tensing said screen member on;

a cavity member fixed on said screen at an open end thereof, the part of the screen surrounded by said end of the cavity being cut off; and a pattern formed on the remaining part of the screen.

Also, there is provided a manufacturing process for manufacturing a printing mask for use in printing on a board having a projecting portion, said process comprising:

a step of applying an adhesive to an open end of a cavity member;

a step of fixing said cavity member on a screen tensed on a frame member;

a step of cutting off the interior portion of the screen member surrounded by said open end of said cavity member; and a step of forming a pattern to be printed on the remaining portion of the screen member.

BRIEF DESCRIPTION OF THE DRAWINGS

The accompanying drawings illustrate the manufacturing processes according to the present invention in which.

DETAILED DESCRIPTION OF THE PREFERRED EMBODIMENTS

The present invention will now be described in detail referring to the preferred embodiments illustrated in the accompanying drawings.

Figure 1A:
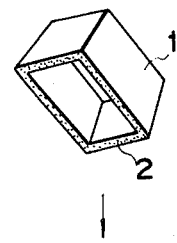
FIGS. 1A-1D show a process using a cloth screen.
Figure 1B:
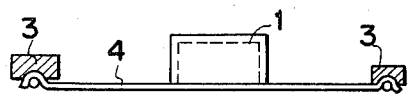
Figure 1C:
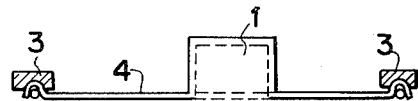
Figure 1D:
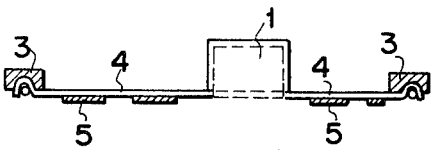
Figure 2A:
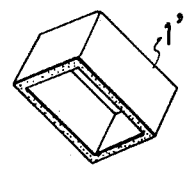
FIGS. 2A-2F show a process using a stainless steel screen.
Figure 2B:
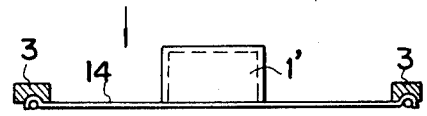
Figure 2C:
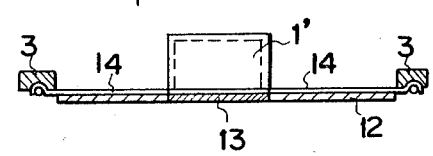
Figure 2D:
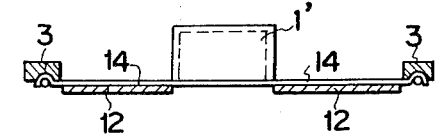
Figure 2E:
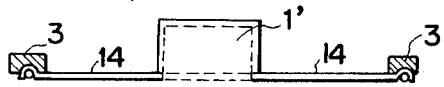
Figure 2F:
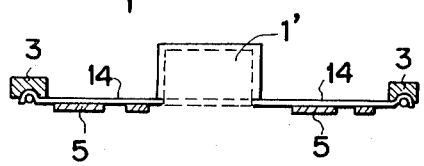

FIGS. 1A-1D show, a manufacturing process for making a printing mask made of cloth such as silk, nylon and other sythetic fibres. An open box-like cavity member 1 is provided with an adhesive bond at the open end 2 thereof as shown in FIG. 1(A). Consequently, the cavity member 1 is put on a cloth screen 4 which is tensed on a mounting frame; and is fixed to it by curing the adhesive bond. Thereafter, the interior portion of the screen 4 surrounded by the open end 2 of the cavity member 1 is cut off as shown in FIG. 1(C) and the remaining portion of the screen; is subjected to a pattern formation by means of an emulsion 5 at the lower surface thereof. Thus, a printing mask for printing on a board with a projecting portion on can be obtained.

FIG. 2 shows a manufacturing process for making a printing mask using a stainless steel screen and a cavity member 1' suitable for metallic plating. The cavity member 1' is put on a desired portion of a screen 14 the screen being again tensed on a frame 3 the cavity again disposed with its with the open end facing the screen as shown in FIG. 2(B). Thereafter, the lower surface of the stainless steel screen 14 is covered by masking 13 over the entire portion surrounded by the exterior edges of the cavity member 1'. The remaining portions of the screen are next coated with resist masking 12. It is preferred to provide the initial masking 13 as above in order to prevent the resist 12 from spreading inward; however, if the resist can be applied without spreading under the cavity edges the masking 13 may be omitted. The cavity member 1' is attached to the stainless steel screen 14 as shown in FIG. 2(D) by means of plating of nickel, for example, after first removing the masking 13 if such masking is used, or alternatively after the resist 12 is applied if the masking 13 is not used. Next, the resist 12 is removed off the lower surface of the screen 14 and the interior portion of the screen surrounded by the open end of the cavity member 1' is cut off as shown in FIG. 2(E). Thereafter, the other part of the screen is formed with a chosen pattern by means of an emulsion 5 at the lower surface thereof. Thus, a printing mask for printing on a board with a projecting portion can be obtained.

In the embodiment of FIG. 2, the box-like cavity member 1' is attached to the stainless steel screen by means of plating. However, it may be attached by means of an adhesive bond or by welding. In this case, the cavity member 1' is not required to be made of a material applicable to plating. At the same time, the resist 13 can also be omitted.

Incidentally, as a matter of fact the, dimension of the cavity member and its location are governed by the size and position of the projecting portion on the board. Additionally, the configuration of the cavity member may be of cylindrical, triangular, or square configuration. Further, the cavity member may be open-shaped at both ends or at one end only. In the latter case, as shown in the drawings the cavity member has to be fixed on the screen at the open end thereof.

As an adhesive for fixing the screen to the cavity member, one cured by ultraviolet rays or one cured by heat may be used.

As described above, according to the present invention, a printing mask for printing on a board having a projecting portion can be manufactured by relatively easy means and a screen surface having a pattern to be printed on a board can be pressed into close engagement with the surface of the board, resulting in printing a circuit without irregularities.

I claim:

1. A printing mask for use in printing on a board having an outwardly projecting portion thereon, said mask comprising:

a screen member;

a tensioning frame member, said screen tensed into a planar configuration thereon; and a rigid member having at least a portion thereof configured with a planar annular region fixedly attached in a continuous path around an interior portion of said screen member, at least a part of said interior portion of said screen member being removed to permit passage of said projecting portion therethrough during printing, said attachment to said annular region permitting retention of tension in the exterior portions of said screen.

2. The printing mask of claim 1 wherein said rigid member is configured in the form of a cavity having side and top walls with said annular region forming an opening thereinto.

3. The printing mask of claims 1 or 2 wherein said screen member and said rigid member are made of electrically conducting material, said rigid member is made of electroplatable material and said rigid member is attached to said screen by electroplated means.

4. The printing mask of claim 1 or 2 wherein said screen member is made of cloth and said rigid member is attached to said screen member by adhesive means.

5. A method for manufacturing a printing mask for use in printing on a board having an outwardly projecting portion thereon, said method comprising the steps of:

mounting a printing screen member in tension on a frame member;

attaching a rigid member to a chosen portion of said screen, said rigid member having an attachment portion thereof configured in the form of a planar annular region, said rigid member being attached to said screen by said attachment portion to form a continuous attachment path around an interior portion of said screen; and removing at least a part of said interior portion of said screen member to permit passage of said projecting portion therethrough during printing.

6. The method of claim 5 wherein said rigid member is attached to said screen by means of a separately applied adhesive coating disposed therebetween.

7. The method of claim 5 wherein said screen member and said rigid member are made of electrically conducting materials, said rigid member is made of an electroplatable material, and said attachment step comprises the steps of:

coating said screen member with an electrically insulating layer on those portions of said screen which are to be external to said annular attachment path on said screen;

placing said rigid member is contact with said screen in the uncoated region thereof;

electroplating said rigid member to said screen; and removing said first insulating layer from said screen.

8. The method of claim 7 further comprising the steps of:

placing a masking layer on said screen, said masking layer configured to cover said annular contacting path and being applied to said screen before applying said insulating layer, so as to act as a barrier to accidental flow of said insulating layer into said annular path during the application of said insulating layer; and removing said masking layer prior to said electroplating step.

9. The method of claims 7 and 8 wherein said screen member is made of stainless steel.

10. The method of claims 5 and 6 wherein said screen member is made of cloth.

* * * * *